United States Patent
Kumar et al.

(10) Patent No.: US 9,859,891 B1
(45) Date of Patent: Jan. 2, 2018

(54) STANDARD CELL ARCHITECTURE FOR REDUCED PARASITIC RESISTANCE AND IMPROVED DATAPATH SPEED

(71) Applicant: QUALCOMM Incorporated, San Diego, CA (US)

(72) Inventors: Dorav Kumar, San Diego, CA (US); Venkatasubramanian Narayanan, San Diego, CA (US); Bala Krishna Thalla, San Diego, CA (US); Seid Hadi Rasouli, San Diego, CA (US); Radhika Vinayak Guttal, San Diego, CA (US); Sivakumar Paturi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 76 days.

(21) Appl. No.: 15/192,872

(22) Filed: Jun. 24, 2016

(51) Int. Cl.
| | |
|---|---|
| *H03K 19/003* | (2006.01) |
| *H01L 27/02* | (2006.01) |
| *H01L 23/528* | (2006.01) |
| *H01L 27/088* | (2006.01) |
| *H03K 19/177* | (2006.01) |

(52) U.S. Cl.
CPC ..... *H03K 19/00361* (2013.01); *H01L 23/528* (2013.01); *H01L 27/0207* (2013.01); *H01L 27/088* (2013.01); *H03K 19/17736* (2013.01)

(58) Field of Classification Search
None
See application file for complete search history.

(56) References Cited

U.S. PATENT DOCUMENTS

| | | |
|---|---|---|
| 8,173,491 B2 | 5/2012 | Law et al. |
| 8,612,914 B2 | 12/2013 | Sherlekar et al. |
| 8,645,892 B1 | 2/2014 | Gupta et al. |

(Continued)

FOREIGN PATENT DOCUMENTS

| | | |
|---|---|---|
| JP | 2009272340 A | 11/2009 |
| WO | 2015138754 A1 | 9/2015 |
| WO | 2016069205 A1 | 5/2016 |

OTHER PUBLICATIONS

International Search Report and Written Opinion—PCT/US2017/029700—ISA/EPO—dated Jul. 18, 2017.

*Primary Examiner* — Jany Richardson
(74) *Attorney, Agent, or Firm* — Arent Fox, LLP

(57) ABSTRACT

A MOS device may include a first logic component with a first input located on a second track and a first output located on the third track. The MOS device may include a second logic component with a second input located on the fourth track and a second output located on a fifth track. For example, the MOS device includes a first interconnect on a $M_x$ layer that is coupled to the first input on the second track. In another example, the MOS device includes a second interconnect on the $M_x$ layer that is coupled to the first output on the third track. The MOS device includes a third interconnect on a $M_y$ layer that is coupled to the second input on the fourth track. Still further, the MOS device includes a fourth interconnect on the $M_y$ layer that is coupled to the second output on the fifth track.

30 Claims, 6 Drawing Sheets

(56) References Cited

U.S. PATENT DOCUMENTS

| | | |
|---|---|---|
| 8,707,239 B2 | 4/2014 | Waller |
| 9,035,679 B2 | 5/2015 | Yuan et al. |
| 9,251,299 B1 | 2/2016 | Salowe |
| 9,502,351 B1 * | 11/2016 | Sahu .................... H01L 27/092 |
| 2006/0113567 A1 | 6/2006 | Ohmori et al. |
| 2007/0132062 A1 | 6/2007 | Banerjee et al. |
| 2010/0213515 A1 * | 8/2010 | Lopes ................. H03K 19/177 |
| | | 257/209 |
| 2013/0126978 A1 | 5/2013 | Becker et al. |
| 2015/0263039 A1 * | 9/2015 | Singh ............... H01L 27/11807 |
| | | 257/206 |
| 2017/0213847 A1 * | 7/2017 | Nebesnyi ........... G06F 17/5009 |

* cited by examiner

STANDARD CELL ARCHITECTURE FOR REDUCED PARASITIC RESISTANCE AND IMPROVED DATAPATH SPEED

BACKGROUND

Field

The present disclosure relates generally to a standard cell architecture, and more particularly, to standard cell architecture for a metal oxide semiconductor (MOS) integrated circuit (IC) device that reduces parasitic resistance and improves datapath speeds.

Background

Standard cells of an integrated circuit implement digital logic. An application-specific integrated circuit (ASIC), such as a system-on-a-chip (SoC) device, may contain thousands to millions of standard cell devices. A typical MOS IC device includes a stack of sequentially formed layers. Each layer may be stacked or overlaid on a prior layer and patterned to form the shapes that define transistors (e.g., field effect transistors (FETs) and/or a fin-shaped FET (Fin-FET)) and connect the transistors into circuits.

As MOS IC devices are fabricated at smaller sizes, manufacturers are finding it more difficult to integrate larger amounts of standard cell devices on a single chip. For example, as the size of MOS IC devices are reduced, an increase in parasitic resistance may be caused by the reduction in the width and thickness of various layers of the MOS IC device. The increase in parasitic resistance may be responsible for a delay of standard cell output.

In addition, using conventional standard cell architecture, when two interconnects on two different metal layers (e.g., a higher metal layer and a lower metal layer) carrying different signals occupy the same track in a MOS IC device and are connected to two different standard cells having inputs and outputs on the same track, the interconnect on the lower metal layer may need to be routed around the track. Routing the interconnect around the track may be necessary because the interconnect on the lower metal layer may run into an input/output stack of the interconnect of the higher metal layer. The routing detour may cause a signal delay on the interconnect on the lower metal layer, and the accumulated signal delay of the interconnect on the lower metal layer may cause a decrease in datapath speed for the MOS IC device.

There is currently a need for a standard cell architecture that reduces the parasitic resistance of smaller MOS IC devices and enables interconnects carrying two different signals on a track to connect to input/output pins on the track without being routed around the track.

SUMMARY

In an aspect of the disclosure, a MOS device may include a first logic component with a first input and a first output. In an aspect, the first input is located on a first track that extends in a first direction and a second track that extends in a second direction that is orthogonal to the first direction. In another aspect, the first output is located on the first track and a third track that extends in the second direction. The MOS device further includes a second logic component with a second input and a second output. In an aspect, the second input is located on the first track and a fourth track that extends in the second direction. In another aspect, the second output is located on the first track and a fifth track that extends in the second direction. In a further aspect, the fourth track and the fifth track are between the second track and the third track. For example, the MOS device includes a first interconnect on a $M_x$ layer that extends on the first track and is coupled to the first input on the second track. In another example, the MOS device includes a second interconnect on the $M_x$ layer that extends on the first track and is coupled to the first output on the third track. In a further example, the MOS device includes a third interconnect on a $M_y$ layer that extends on the first track and is coupled to the second input on the fourth track. In an aspect, y is greater than x. Still further, the MOS device includes a fourth interconnect on the $M_y$ layer that extends on the first track and is coupled to the second output on the fifth track.

In another aspect of the disclosure, a method of operation of a MOS IC includes propagating a first signal through a first logic component with a first input and a first output. In an aspect, the first input is located on a first track that extends in a first direction and a second track that extends in a second direction that is orthogonal to the first direction. In another aspect, the first output is located on the first track and a third track that extends in the second direction. The method further includes propagate a second signal through a second logic component with a second input and a second output. In an aspect, the second input is located on the first track and a fourth track that extends in the second direction. In another aspect, the second output is located on the first track and a fifth track that extends in the second direction. In a further aspect, the fourth track and the fifth track are between the second track and the third track. For example, the MOS device includes a first interconnect on a $M_x$ layer that extends on the first track and is coupled to the first input on the second track. In another example, the MOS device includes a second interconnect on the $M_x$ layer that extends on the first track and is coupled to the first output on the third track. In a further example, the MOS device includes a third interconnect on a $M_y$ layer that extends on the first track and is coupled to the second input on the fourth track. In an aspect, y is greater than x. Still further, the MOS device includes a fourth interconnect on the $M_y$ layer that extends on the first track and is coupled to the second output on the fifth track.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

As MOS IC devices are fabricated at smaller sizes, manufacturers are finding it more difficult to integrate larger amounts of standard cell devices on a single chip. For example, as the size of MOS IC devices are reduced, an increase in parasitic resistance may be caused by the reduction in the width and thickness of various layers of the MOS IC device. The increase in parasitic resistance may be responsible for a delay of standard cell output.

MOS IC device standard cells may be designed up to the metal x (Mx) layer interconnect, where x≤3. One way to reduce the parasitic resistance of smaller MOS IC devices may be to design the standard cells up to a higher metal layer, such as an metal 5 (M5) layer interconnect or an metal 6 (M6) layer interconnect. By designing standard cells with higher metal layer interconnects, additional vias may also be included that connect the higher metal layer interconnects to lower metal layer interconnects. The additional metal layer interconnects and vias may provide additional parallel current paths that are able to reduce the overall parasitic resistance of the standard cell, as compared to a standard cell only designed up to the Mx layer interconnect.

In addition, using conventional standard cell architecture, when two interconnects on two different metal layer interconnects (e.g., a higher metal 9 (M9) layer and a lower metal 7 (M7) layer) carrying different signals occupy the same track in a MOS IC device and are connected to two different standard cells having inputs and outputs on the same track, the interconnect on the lower metal layer may need to be routed around the track. Routing the interconnect around the track may be necessary because the interconnect on the lower metal layer may run into an input/output stack of the interconnect of the higher metal layer. The routing detour may cause a signal delay on the interconnect on the lower metal layer, and the accumulated signal delay of the interconnect on the lower metal layer may cause a decrease in datapath speed for the MOS IC device, as discussed infra with respect to FIG. 1.

Figure 1:
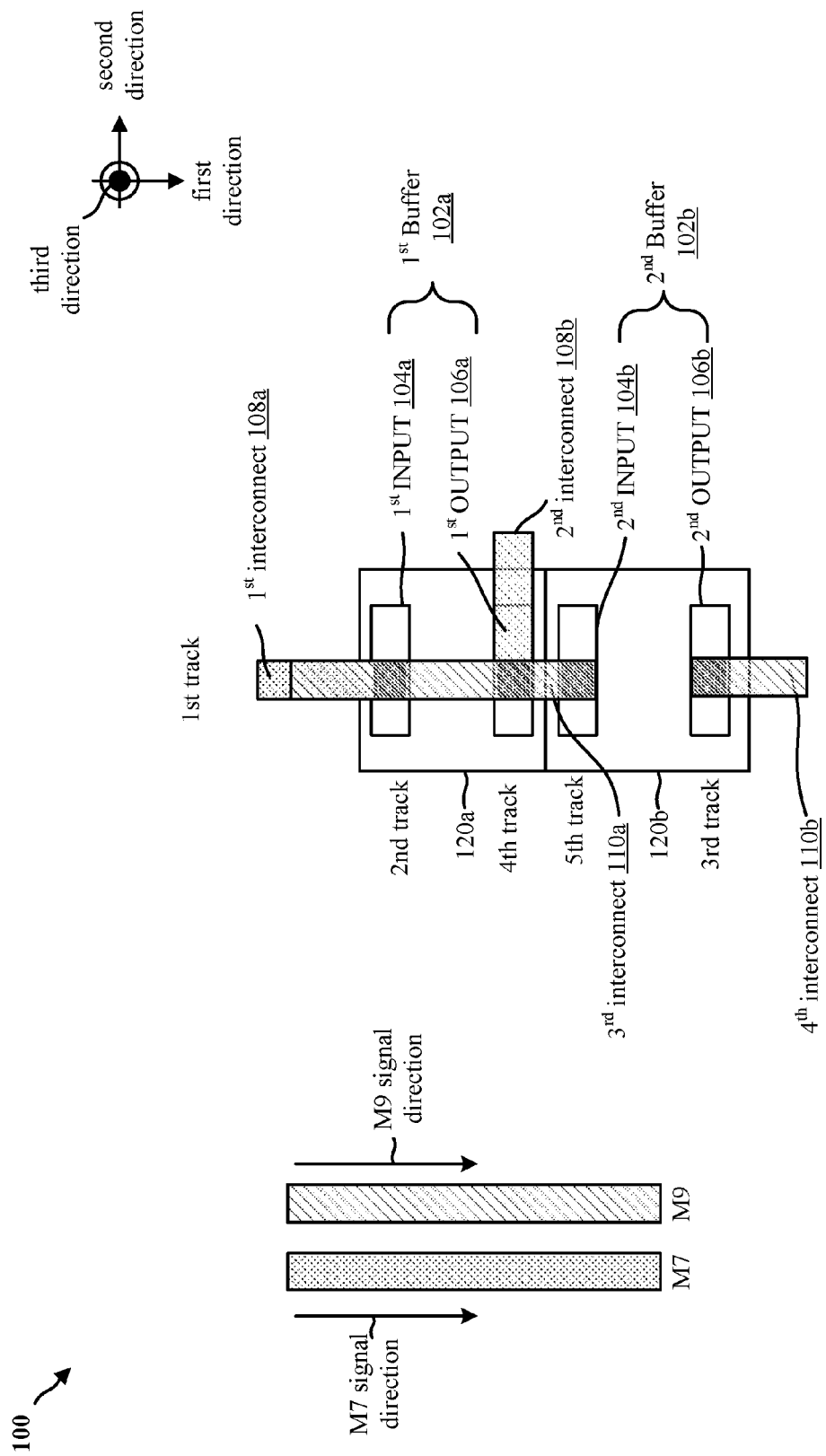
FIG. 1 is a diagram illustrating a plan view of an example MOS IC device in accordance with an aspect of the disclosure.

FIG. 1 is a diagram illustrating a plan view of an example MOS IC device 100 including a first standard cell 120a and a second standard cell 120b designed with metal layers up to M6 layer to reduce parasitic resistance as discussed supra. The first standard cell 120a includes a first buffer 102a, and the second standard cell 120b includes a second buffer 102b (e.g., a 2-bit buffer).

As further illustrated in FIG. 1, the first buffer 102a includes a first input 104a (e.g., a first input pin) and a first output 106a (e.g., a first output pin). For example, the first input 104a may be located on a first track (e.g., vertical track) that extends in a first direction and a second track (e.g., horizontal track) that extends in a second direction. In an aspect, the first input 104a may correspond to a first M6 layer interconnect. Furthermore, the first output 106a may be located on the first track that extends in the first direction and a third track (e.g., horizontal track) that extends in the second direction. In another aspect, the first output 106a may correspond to a second M6 layer interconnect. As indicated in the top right corner of FIG. 1, the first direction is orthogonal to the second direction.

In addition, the second buffer 102b includes a second input 104b (e.g., a second input pin) and a second output 106b (e.g., a second output pin). For example, the second input 104b may be located on the first track that extends in the first direction and a fourth track (e.g., horizontal track) that extends in the second direction. In one aspect, the second input 104b may correspond to a first M8 layer interconnect. Furthermore, the second output 106b may be located on the first track that extends in the first direction and a fifth track (e.g., horizontal track) that extends in the second direction. In another aspect, the second output 106b may correspond to a second M8 layer interconnect.

As also illustrated in FIG. 1, an M7 layer and an M9 layer both extend along the first track. For example, the M9 layer is formed above the M7 layer in a third direction as indicated in the top right corner of FIG. 1. Furthermore, the signals carried on each of M7 layer and M9 layer travel in the same direction as indicated on the left hand side of FIG. 1. Although the M9 layer extends over the entirety of the M7 layer, portions of the M9 layer are not shown in FIG. 1 so not to obscure the view of the M7 layer of the first input 104a.

In the example MOS IC device 100, a first interconnect 108a on the M7 layer may be coupled through a via to the first input 104a (e.g., on an M6 layer) on the second track. In addition, a second interconnect 108b may be connected through a via to the first output 106a (e.g., on an M6 layer) on the fourth track with a routing detour from the first track. Still further, a third interconnect 110a on the M9 layer may be coupled through a via to the second input 104b (e.g., on an M8 layer) on the fifth track. In addition, a fourth interconnect 110b on the M9 layer may be coupled through a via to the second output 106b (e.g., on an M8 layer) on the third track.

However, because the stack that corresponds to the second input 104b extends up to the M9 layer, the second interconnect 108b is unable to connect to second standard cell 120b without a routing detour from the first track. As discussed supra, the routing detour may cause a signal delay, and the accumulated signal delay of the routing detour may cause a decrease in datapath speed in the MOS IC device 100 illustrated in FIG. 1.

Figure 2:
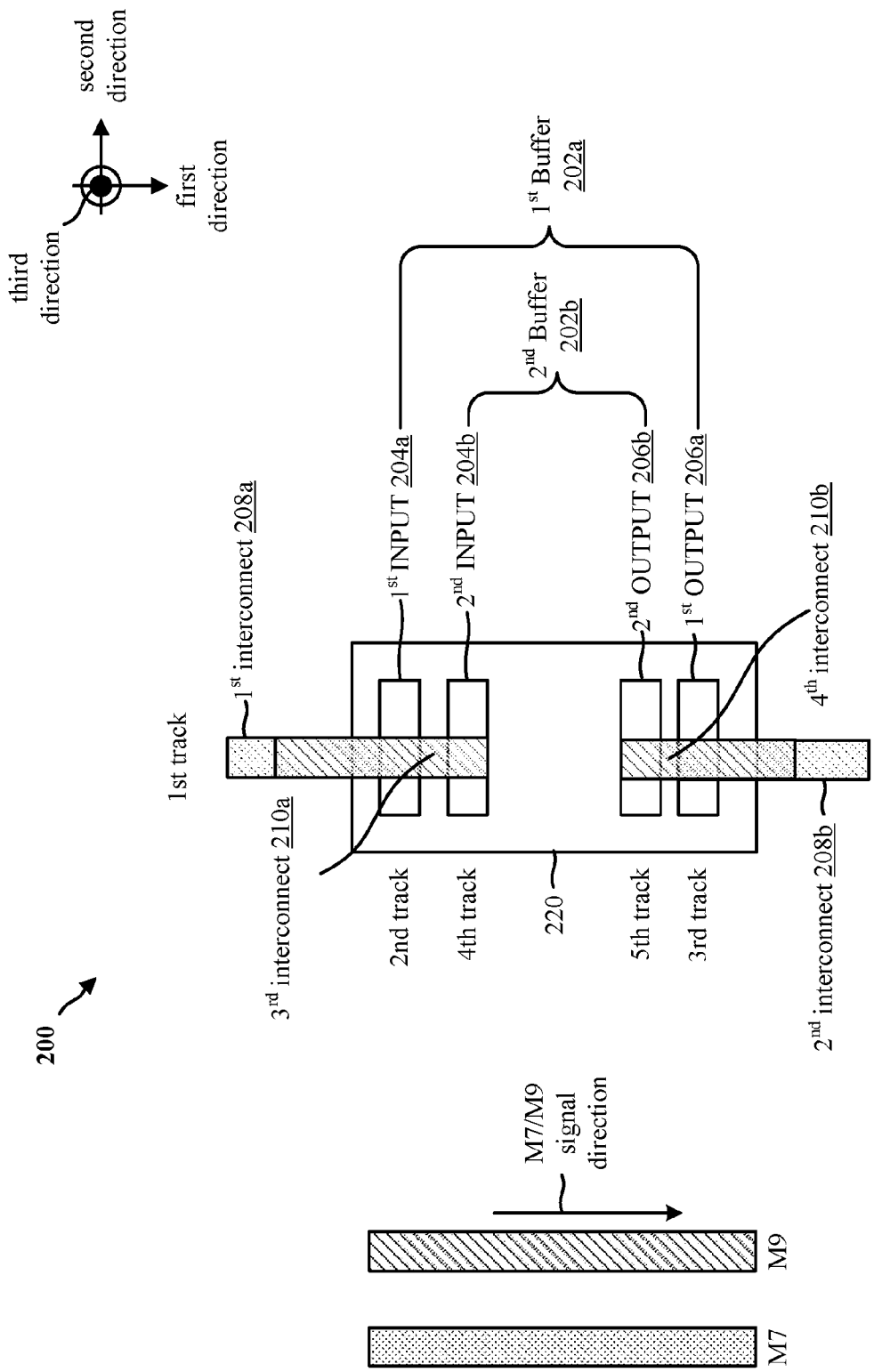
FIG. 2 is a diagram illustrating a plan view of an exemplary MOS IC device in accordance with an aspect of the disclosure.

FIG. 2 illustrates an exemplary MOS IC device 200 including a standard cell 220 designed with metal layers up to M6/M8 layers to reduce parasitic resistance. The MOS IC device includes a first buffer 202a and a second buffer 202b (e.g., a 2-bit buffer). In an aspect, the exemplary MOS IC device 200 illustrated in FIG. 2 may not require a routing detour to connect the M7 layer interconnect to a buffer output.

As further illustrated in FIG. 2, the first buffer 202a includes a first input 204a (e.g., a first input pin) and a first output 206a (e.g., a first output pin). For example, the first input 204a may be located on a first track (e.g., vertical track) that extends in a first direction and a second track (e.g., horizontal track) that extends in a second direction. In an aspect, the first input 204a may correspond to a first M6 layer interconnect. Furthermore, the first output 206a may be located on the first track that extends in the first direction and a third track (e.g., horizontal track) that extends in the second direction. In another aspect, the first output 206a may correspond to a second M6 layer interconnect. As indicated in the top right corner of FIG. 2, the first direction is orthogonal to the second direction.

In addition, the second buffer 202*b* includes a second input 204*b* (e.g., a second input pin) and a second output 206*b* (e.g., a second output pin). For example, the second input 204*b* may be located on the first track that extends in the first direction and a fourth track (e.g., horizontal track) that extends in the second direction. In one aspect, the second input 204*b* may correspond to a first M8 layer interconnect.

Furthermore, the second output 206*b* may be located on the first track that extends in the first direction and a fifth track (e.g., horizontal track) that extends in the second direction. In another aspect, the second output 206*b* may correspond to a second M8 layer interconnect.

As also illustrated in FIG. 2, an M7 layer interconnect and an M9 layer interconnect both extend along the first track. For example, the M9 layer interconnect is formed above the M7 layer interconnect in a third direction as indicated in the top right corner of FIG. 2. Furthermore, the signals carried on each of M7 layer interconnect and M9 layer interconnect travel in the same direction as indicated on the left hand side of FIG. 2. Although the M9 layer interconnect extends over the entirety of the M7 layer interconnect, portions of the M9 layer interconnect are not shown in FIG. 2 so as not to obscure the view of the M7 layer interconnect of the first input 204*a* and the first output 206*a*.

In the exemplary MOS IC device 200, a first interconnect 208*a* on the M7 layer may be coupled to the first input 204*a* (e.g., the first M6 layer interconnect) on the second track. For example, the first interconnect 208*a* may be coupled to the first input 204*a* through a via that connects the first interconnect 208*a* to the first input 204*a* of the MOS IC device 200.

In addition, a second interconnect 208*b* on the M7 layer may be coupled to the first output 206*a* (e.g., the second M6 layer interconnect) on the third track. For example, second interconnect 208*b* may be coupled to the first output 206*a* through a via that connects the M7 layer to the first output 206*a* of the MOS IC device 200.

Still further, a third interconnect 210*a* on the M9 layer may be coupled to the second input 204*b* (e.g., the first M8 layer interconnect) on the fourth track. For example, the third interconnect 210*a* may be coupled to the second input 204*b* through a via that connects the third interconnect 210*a* to the second input 204*b* of the MOS IC device 200.

In addition, a fourth interconnect 210*b* on the M9 layer may be coupled to the second output 206*b* (e.g., the second M8 layer interconnect) on the fifth track. For example, fourth interconnect 210*b* may be coupled to the second output 206*b* through a via that connects the fourth interconnect 210*b* to the second output 206*b* of the MOS IC device 200.

The first interconnect 208*a*, the second interconnect 208*b*, the third interconnect 210*a*, and the fourth interconnect 210*b* may be used as inter-cell routing between the standard cell 220 and another standard cell (not shown in FIG. 2). In the exemplary embodiment illustrated in FIG. 2, the standard cell 220 is a quadruple height cell with the four rows including the second through fifth track. It should be understood, that the aspects disclosed herein may also be applied to a single height cell, a double height cell, a triple height cell, or any other cell height without departing from the scope of the present disclosure.

By orienting the first input 204*a*, the second input 204*b*, the first output 206*a*, and the second output 206*b* as shown in FIG. 2, the connection of the M9 layer interconnects in a stack to transistors of the MOS IC device 200 may not block the M7 layer interconnects from extending on the first track. Therefore, routing detours of the M7 layer interconnects may be avoided and datapath speeds may be improved in the MOS IC device 200 illustrated in FIG. 2.

Figure 3:
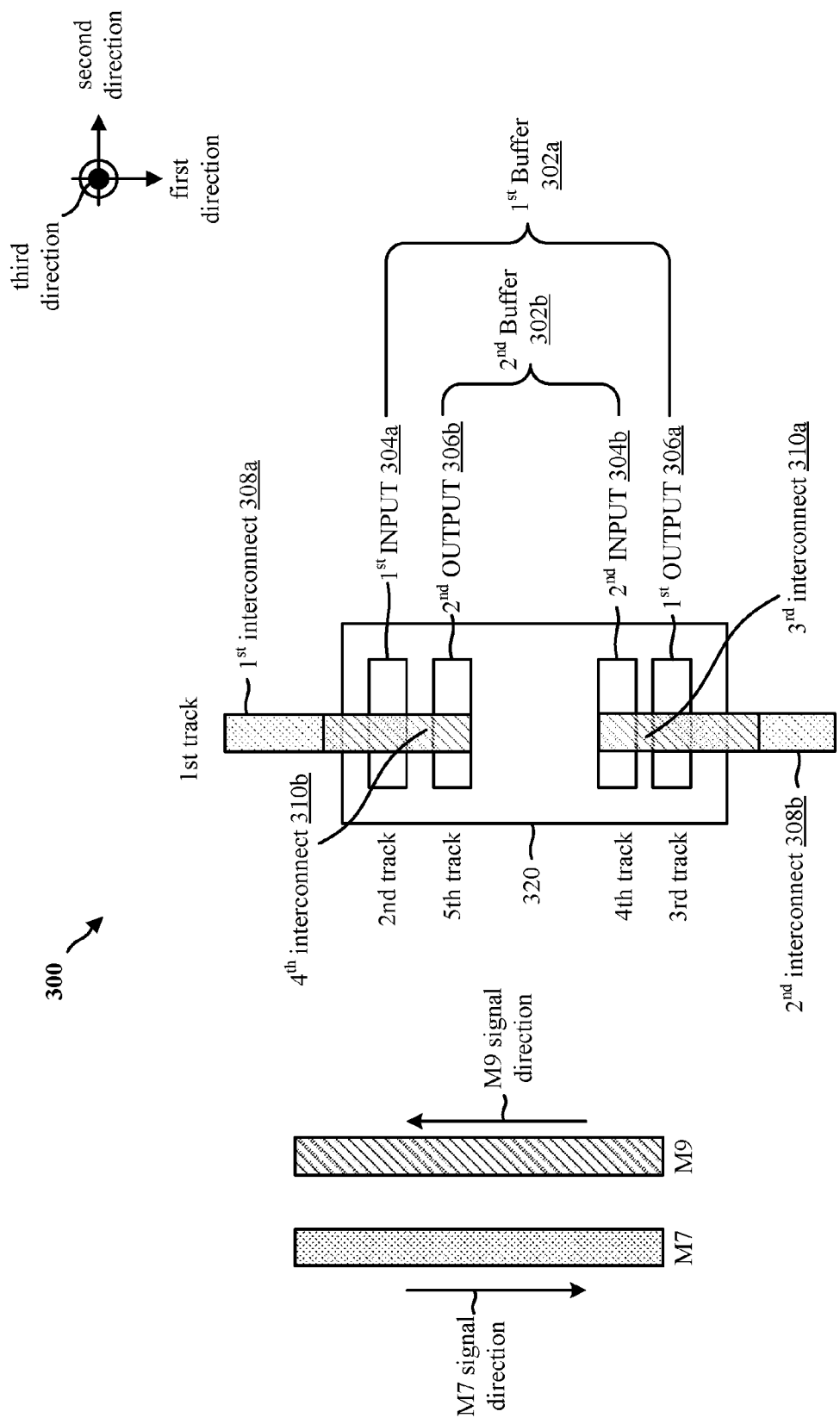
FIG. 3 is a diagram illustrating a plan view of an exemplary MOS IC device in accordance with an aspect of the disclosure.

FIG. 3 illustrates an exemplary MOS IC device 300 including a standard cell 320 each designed with metal layers up to M6/M8 layers to reduce parasitic resistance. The MOS IC device 300 also includes a first buffer 302*a* and a second buffer 302*b* (e.g., a 2-bit buffer). In addition, the exemplary MOS IC device 300 illustrated in FIG. 3 may not require a routing detour to connect the M7 to a buffer output.

As further illustrated in FIG. 3, the first buffer 302*a* includes a first input 304*a* (e.g., a first input pin) and a first output 306*a* (e.g., a first output pin). For example, the first input 304*a* may be located on a first track (e.g., vertical track) that extends in a first direction and a second track (e.g., horizontal track) that extends in a second direction. In an aspect, the first input 304*a* may correspond to a first M6 layer interconnect. Furthermore, the first output 306*a* may be located on the first track that extends in the first direction and a third track (e.g., horizontal track) that extends in the second direction. In another aspect, the first output 306*a* may correspond to a second M6 layer interconnect. As indicated in the top right corner of FIG. 3, the first direction is orthogonal to the second direction.

In addition, the second buffer 302*b* includes a second input 304*b* (e.g., a second input pin) and a second output 306*b* (e.g., a second output pin). For example, the second input 304*b* may be located on the first track that extends in the first direction and a fourth track (e.g., horizontal track) that extends in the second direction. In one aspect, the second input 304*b* may correspond to a first M8 layer interconnect. Furthermore, the second output 306*b* may be located on the first track that extends in the first direction and a fifth track (e.g., horizontal track) that extends in the second direction. In another aspect, the second output 306*b* may correspond to a second M8 layer interconnect.

As also illustrated in FIG. 3, an M7 layer interconnect and an M9 layer interconnect both extend along the first track. For example, the M9 layer interconnect is formed above the M7 layer interconnect in a third direction as indicated in the top right corner of FIG. 3. Furthermore, the signals carried on each of M7 layer interconnect and M9 layer interconnect travel in opposite directions as indicated on the left hand side of FIG. 3. Although the M9 layer interconnect extends over the entirety of the M7 layer interconnect, portions of the M9 layer interconnect are not shown in FIG. 3 so as not to obscure the view of the M7 layer interconnects of the first input 304*a* and the first output 306*a*.

In the exemplary MOS IC device 300, a first interconnect 308*a* on the M7 layer may be coupled to the first input 304*a* (e.g., the first M6 layer interconnect) on the second track. For example, the first interconnect 308*a* may be coupled to the first input 304*a* through a via that connects the first interconnect 308*a* to the first input 304*a* of the MOS IC device 300.

In addition, a second interconnect 308*b* on the M7 layer may be coupled to the first output 306*a* (e.g., the second M6 layer interconnect) on the third track. For example, the second interconnect 308*b* may be coupled to the first output 306*a* through a via that connects the second interconnect 308*b* to the first output 306*a* of the MOS IC device 300.

Still further, a third interconnect 310*a* on the M9 layer may be coupled to the second input 304*b* (e.g., the first M8 layer interconnect) on the fourth track. For example, the third interconnect 310*a* may be coupled to the second input 304b through a via that connects the third interconnect 310a to the second input 304b the MOS IC device 300.

In addition, a fourth interconnect 310b on the M9 layer may be coupled to the second output 306b (e.g., the second M8 layer interconnect) on the fifth track. For example, the fourth interconnect 310b may be coupled to the second output 306b through a via that connects the fourth interconnect 310b to the second output 306b of the MOS IC device 300.

The first interconnect 308a, the second interconnect 308b, the third interconnect 310a, and the fourth interconnect 310b may be used as inter-cell routing between the standard cell 320 and another standard cell (not shown in FIG. 3). In the exemplary embodiment illustrated in FIG. 3, the standard cell 320 is a quadruple height cell with the four rows including the second through fifth track. It should be understood, that the aspects disclosed herein may also be applied to a single height cell, a double height cell, a triple height cell, or any other cell height without departing from the scope of the present disclosure.

By orienting the first input 304a, the second input 304b, the first output 306a, and the second output 306b as shown in FIG. 3, the connection of the M9 layer interconnects in a stack to transistors of the MOS IC device 300 may not block the M7 layer interconnects from extending on the first track. Therefore, routing detours of the M7 layer interconnects may be avoided and datapath speeds may be improved in the MOS IC device 300 illustrated in FIG. 3.

Figure 4:
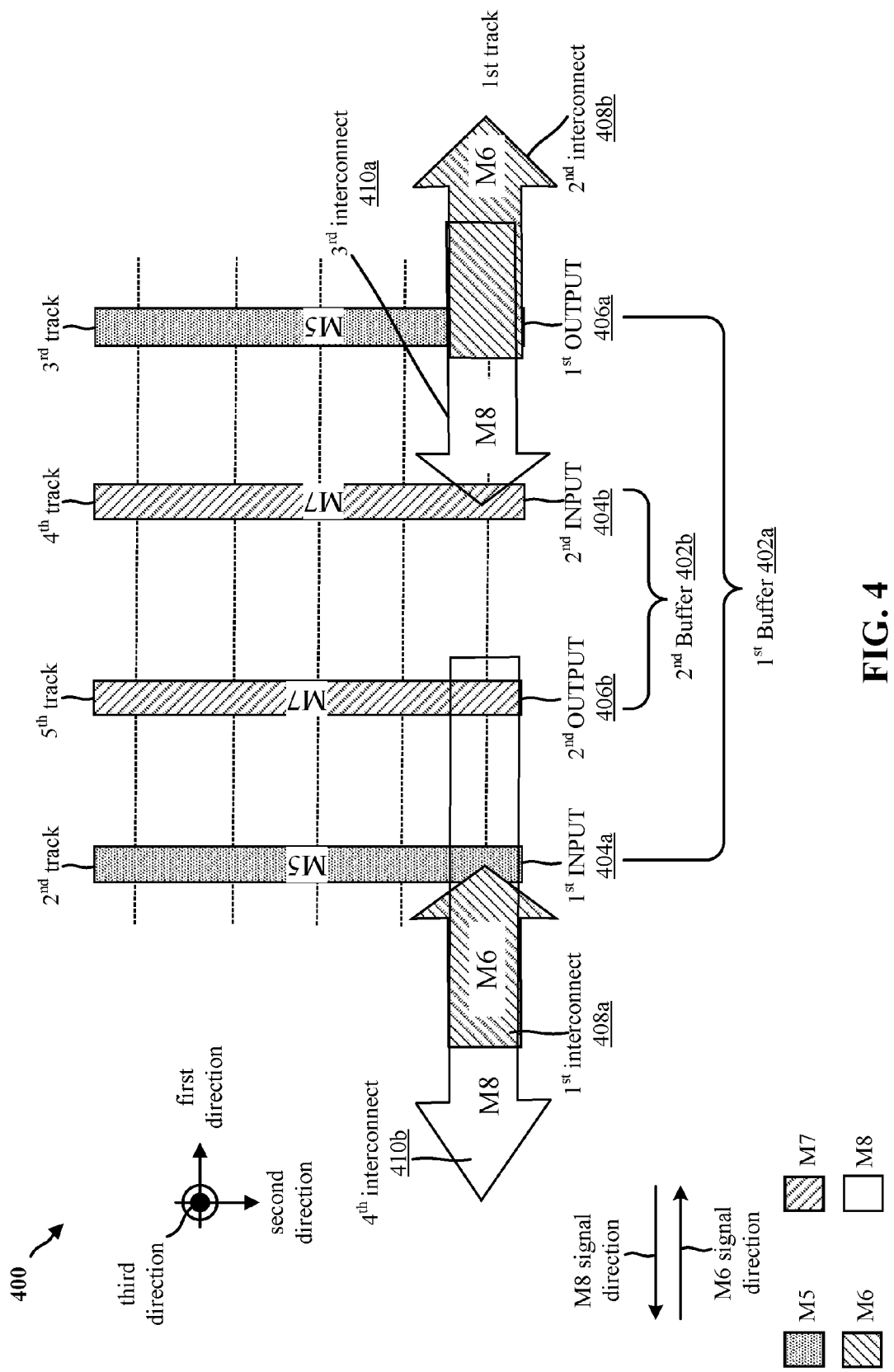
FIG. 4 is a diagram illustrating a plan view of an exemplary MOS IC device in accordance with an aspect of the disclosure.

FIG. 4 illustrates an exemplary MOS IC device 400 with metal layers up to M5/M7 layers to reduce parasitic resistance. The MOS IC device 400 includes, for example, a first buffer 402a and a second buffer 402b (e.g., a 2-bit buffer). In addition, the exemplary MOS IC device 400 illustrated in FIG. 4 may not require a routing detour of an M6 layer interconnect from the first track the MOS IC device 400.

As further illustrated in FIG. 4, the first buffer 402a includes a first input 404a (e.g., a first input pin) and a first output 406a (e.g., a first output pin). For example, the first input 404a may be located on a first track (e.g., vertical track) that extends in a first direction and a second track (e.g., horizontal track) that extends in a second direction. In an aspect, the first input 404a may correspond to a first M5 layer interconnect. Furthermore, the first output 406a may be located on the first track that extends in the first direction and a third track (e.g., horizontal track) that extends in the second direction. In another aspect, the first output 406a may correspond to a second M5 layer interconnect. As indicated in the top right corner of FIG. 4, the first direction is orthogonal to the second direction.

In addition, the second buffer 402b includes a second input 404b (e.g., a second input pin) and a second output 406b (e.g., a second output pin). For example, the second input 404b may be located on the first track that extends in the first direction and a fourth track (e.g., horizontal track) that extends in the second direction. In one aspect, the second input 404b may correspond to a first M7 layer interconnect. Furthermore, the second output 406b may be located on the first track that extends in the first direction and a fifth track (e.g., horizontal track) that extends in the second direction. In another aspect, the second output 406b may correspond to a second M7 layer interconnect.

As also illustrated in FIG. 4, an M6 layer interconnect and an M8 layer interconnect both extend along the first track. For example, the M8 layer interconnect is formed above the M6 layer interconnect in a third direction as indicated in the top right corner of FIG. 4. Furthermore, the signals carried on each of M6 layer interconnect and M8 layer interconnect travel in opposite directions as indicated on the left hand side of FIG. 4. Although the M8 layer interconnect extends over the entirety of the M6 layer interconnect, portions of the M8 layer interconnect are not shown in FIG. 4 so as not to obscure the view of the M6 layer interconnects of the first input 404a and the first output 406a.

In the exemplary MOS IC device 400, a first interconnect 408a on the M6 layer may be coupled to the first input 404a (e.g., the first M5 layer interconnect) on the second track. For example, the first interconnect 408a may be coupled to the first input 404a through a via that connects the first interconnect 408a to the first input 404a of the MOS IC device 400.

In addition, a second interconnect 408b on the M6 layer may be coupled to the first output 406a (e.g., the second M5 layer interconnect) on the third track. For example, the second interconnect 408b may be coupled to the first output 406a through a via that connects the second interconnect 408b to the first output 406a of the MOS IC device 400.

Still further, a third interconnect 410a on the M8 layer may be coupled to the second input 404b (e.g., the first M7 layer interconnect) on the fourth track. For example, the third interconnect 410a may be coupled to the second input 404b through a via that connects the third interconnect 410a to the second input 404b the MOS IC device 400.

In addition, a fourth interconnect 410b on the M8 layer may be coupled to the second output 406b (e.g., the second M7 layer interconnect) on the fifth track. For example, the fourth interconnect 410b may be coupled to the second output 406b through a via that connects the fourth interconnect 410b to the second output 406b of the MOS IC device 400.

By orienting the first input 404a, the second input 404b, the first output 406a, and the second output 406b as shown in FIG. 4, the connection of the M8 layer interconnects in a stack to transistors of the MOS IC device 400 may not block the M6 layer interconnects from extending on the first track. Therefore, routing detours of the M6 layer interconnects may be avoided and datapath speeds may be improved in the MOS IC device 400 illustrated in FIG. 4.

Although a 2-bit buffer system is illustrated in the exemplary MOS IC devices 200, 300, 400 of FIGS. 2-4, it should be understood that the aspects disclosed herein are not limited to a 2-bit buffer system. For example, the exemplary aspects disclosed herein may be applied to a buffer system that includes more than 2 buffers (e.g., 3-bit buffer, 4-bit buffer, etc.) without departing from the scope of the present disclosure.

Figure 5:
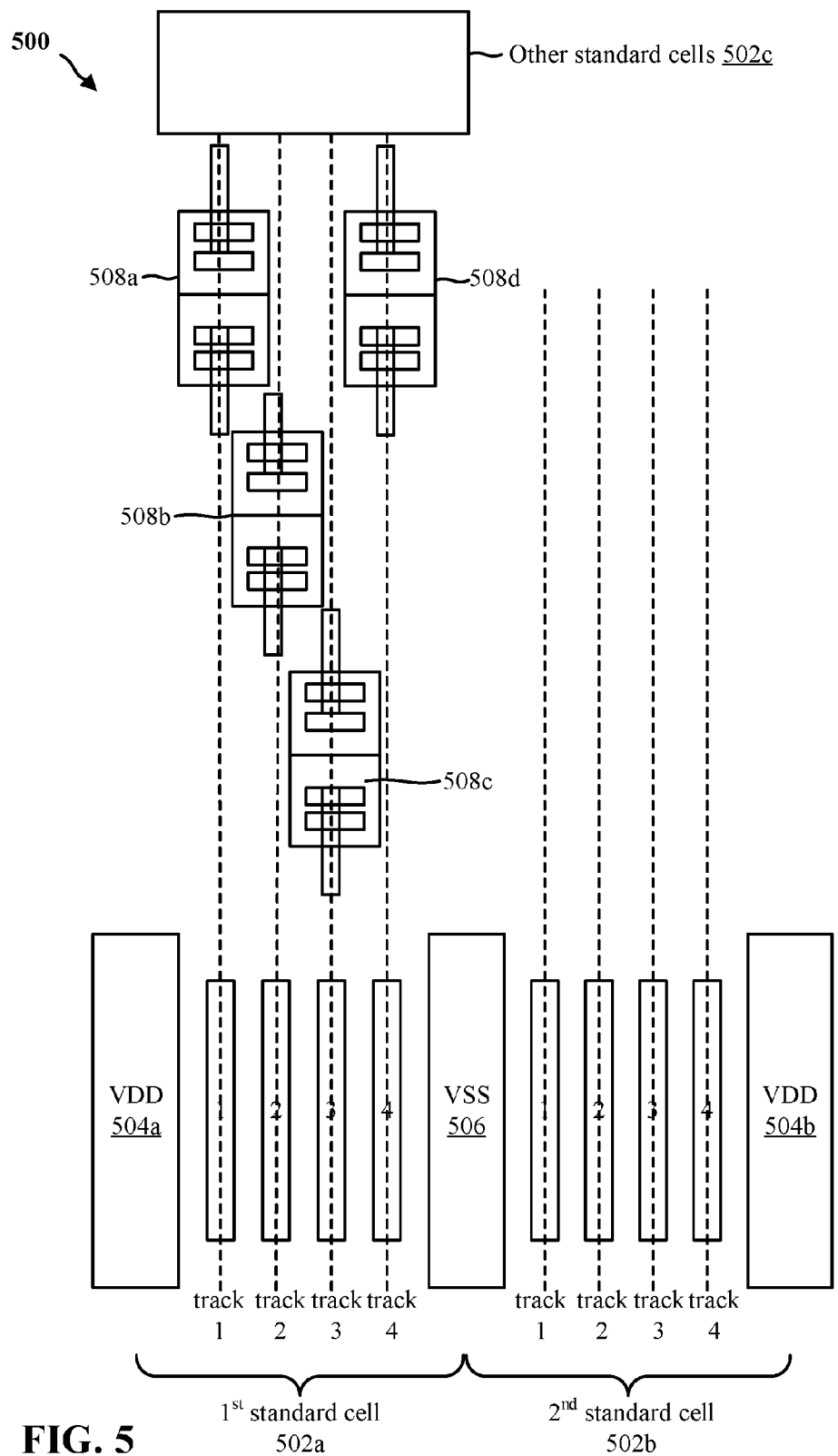
FIG. 5 is a diagram illustrating a plan view of an exemplary MOS IC device in accordance with an aspect of the disclosure.

FIG. 5 illustrates an exemplary MOS IC device 500 in accordance with one aspect of the present disclosure. For example, the MOS IC device 500 may include a first standard cell 502a, a second standard cell 502b, and at least one other standard cell 502c. Each of the first standard cell 502a and the second standard cell 502b include a first track, a second track, a third track, and a fourth track. Still further, the first standard cell 502a includes a $V_{dd}$ power rail 504a and a $V_{ss}$ power rail 506, and the second standard cell 502b includes the $V_{ss}$ power rail 506 and a $V_{dd}$ power rail 504b.

In order to efficiently use the tracks in the first standard cell 502a, each of the 2-bit buffers 508a, 508b, 508c, and 508d may be staggered to include the greatest amount of 2-bit buffers in the MOS IC device 500 while operating within the spacing requirements for a standard cell.

Referring again to FIGS. 2-5, a MOS device (200, 300, 400, 500) includes a first logic component (202a, 302a, 402a) with a first input (204a, 304a, 404a) and a first output (206a, 306a, 406a). In an aspect, the first input (204a, 304a, 404a) is located on a first track that extends in a first direction and a second track that extends in a second direction orthogonal to the first direction. In another aspect, the first output (206a, 306a, 406a) is located on the first track and a third track that extends in the second direction.

In another aspect of the disclosure, the MOS device (200, 300, 400, 500) includes a second logic component (202b, 302b, 402b) with a second input (204b, 304b, 404b) and a second output (206b, 306b, 406b). In an aspect, the second input (204b, 304b, 404b) is located on the first track and a fourth track that extends in the second direction. In another aspect, the second output (206b, 306b, 406b) is located on the first track and a fifth track that extends in the second direction. In a further aspect, the fourth track and the fifth track are between the second track and the third track (see FIGS. 2-4).

In a further aspect of the disclosure, the MOS device (200, 300, 400, 500) includes a first interconnect (208a, 308a, 408a) on a metal x ($M_x$) layer (e.g., the M7 layer in FIGS. 2 and 3, and the M6 layer interconnect in FIG. 4) that extends on the first track and that is coupled to the first input (204a, 304a, 404a) on the second track.

In yet another aspect of the disclosure, the MOS device (200, 300, 400, 500) includes a second interconnect (208b, 308b, 408b) on the $M_x$ layer (e.g., the M7 layer in FIGS. 2 and 3, and the M6 layer interconnect in FIG. 4) that extends on the first track and that is coupled to the first output (206a, 306a, 406a) on the third track.

In still another aspect of the disclosure, the MOS device (200, 300, 400, 500) includes a third interconnect (210a, 310a, 410a) on a metal y ($M_y$) layer (e.g., the M9 layer in FIGS. 2 and 3, and the M8 layer in FIG. 4) that extends on the first track and is coupled to the second input (204b, 304b, 404b) on the fourth track. For example, y (e.g., y=9 in FIGS. 2 and 3, and y=8 in FIG. 4) is greater than x (e.g., x=7 in FIGS. 2 and 3, and x=6 in FIG. 4).

Further still, the MOS device (200, 300, 400, 500) includes a fourth interconnect (210b, 310b, 410b) on the $M_y$ layer (e.g., the M9 layer in FIGS. 2 and 3, and the M8 layer in FIG. 4) that extends on the first track and that is coupled to the second output (206b, 306b, 406b) on the fifth track.

In an additional aspect, the first logic component (202a, 302a, 402a) and the second logic component (202b, 302b, 402b) are part of a standard cell (220, 320, 502a) in the MOS device (200, 300, 500).

Still further, the first interconnect (208a, 308a, 408a), the second interconnect (208b, 308b, 408b), the third interconnect (210a, 310a, 410a), and the fourth interconnect (210b, 310b, 410b) are inter-cell routing between the standard cell (502a) and at least one other standard cell (502c).

Additionally, the standard cell (502a) may be a quadruple height cell with four rows (see FIGS. 2-4) including a first row (see FIGS. 2-4), a second row (see FIGS. 2-4) adjacent the first row (see FIGS. 2-4), a third row adjacent the second row (see FIGS. 2-4), and a fourth row adjacent the third row (see FIGS. 2-4). For example, the second track (see FIGS. 2-4) is in the first row (see FIGS. 2-4). In an aspect, the third track (see FIGS. 2-4) is in the fourth row (see FIGS. 2-4). In another aspect, the fourth track (see FIGS. 2-4) is in one of the second row (see FIG. 2) or the third row (see FIGS. 3 and 4). In an additional aspect, the fifth track (see FIGS. 2-4) is in another one of the second row (see FIGS. 3 and 4) or the third row (see FIG. 2).

In a further aspect, the first input (204a, 304a, 404a) corresponds to a first input pin (204a, 304a, 404a). In another aspect, the first output (206a, 306a, 406a) corresponds to a first output pin (206a, 306a, 406a). In an additional aspect, the second input (204b, 304b, 404b) corresponds to a second input pin (204b, 304b, 404b). Further still, the second output (206b, 306b, 406b) corresponds to a second output pin (206b, 306b, 406b). In one example, the first input pin (204a, 304a, 404a) corresponds to a metal x-$z_1$ ($M_{x\text{-}z1}$) layer interconnect (e.g., the M7 layer interconnect in FIGS. 2 and 3, and the M5 layer interconnect in FIG. 4). For example, $z_1 \geq 1$. In another aspect, the first output pin (206a, 306a, 406a) corresponds to a metal x-$z_2$ ($M_{x\text{-}z2}$) layer interconnect (e.g., the M8 layer interconnect in FIGS. 2 and 3, and the M5 layer interconnect in FIG. 4). For example, $z_2 \geq 1$. In a further aspect, the second input pin (204b, 304b, 404b) corresponds to a metal y-$z_3$ ($M_{y\text{-}z3}$) layer interconnect (e.g., the M8 layer interconnect in FIGS. 2 and 3, and the M7 layer interconnect in FIG. 4). For example, $z_3 \geq 1$. Further still, the second output pin (206b, 306b, 406b) corresponds to a metal y-$z_4$ ($M_{y\text{-}z4}$) layer interconnect (e.g., the M8 layer interconnect in FIGS. 2 and 3, and the M7 layer interconnect in FIG. 4). For example, $z_4 \geq 1$. In a further example, $z_1$, $z_2$, $z_3$, and $z_4$ are each equal to 1. When $z_1$, $z_2$, $z_3$, and $z_4$ are each equal to 1, then the input/output pins are located one metal layer below the aforementioned M6, M7, M8, M9 signal line interconnects. As such z is a number of metal layers below the M6, M7, M8, M9 signal line interconnects which the input/output pins are located.

In one example, the fifth track is between the fourth track and the third track (see FIG. 2). In another example, the first interconnect (208a) and the third interconnect overlap (210a) in a third direction. In a further example, the second interconnect (208b) and the fourth interconnect (210b) overlap in the third direction. For example, the third direction is orthogonal to the first direction and the second direction.

In another example, the fourth track is between the fifth track and the third track (see FIGS. 3 and 4). In an aspect, the first interconnect (308a, 408a) and the fourth interconnect (310b, 410b) overlap in a third direction. In further aspect, the second interconnect (308b, 408b) and the third interconnect (310a, 410a) overlap in the third direction. For example, the third direction is orthogonal to the first direction and the second direction.

In still a further aspect, the first logic component (202a, 302a, 402a) is a first buffer (202a, 302a, 402a). In another aspect, the second logic component (202b, 302b, 402b) is a second buffer (202b, 302b, 402b).

In another aspect, the first track is a vertical track (e.g., FIGS. 2 and 3). In a further aspect, the second track, the third track, the fourth track, and the fifth track are each horizontal tracks (e.g., FIGS. 2 and 3).

In a further aspect, the first track is a horizontal track (e.g., FIG. 4). In an additional aspect, the second track, the third track, the fourth track, and the fifth track are each vertical tracks (e.g., FIG. 4).

In another aspect, the first logic component (202a, 302a, 402a) and the second logic component (202b, 302b, 402b) are part of a first buffer (508a) positioned on the first track (track 1 in the first standard cell 502a in FIG. 5). In addition, the MOS device (500) also includes a second buffer (508b) positioned on a sixth track (e.g., track 2 in the first standard cell 502a in FIG. 5) that is parallel to the first track (track 1 in the first standard cell 502a in FIG. 5). For example, second buffer (508b) is non-adjacent to the first buffer (508a). In a further aspect, the MOS device (500) includes a third buffer (508c) positioned on a seventh track (track 3 in the first standard cell 502a in FIG. 5) that is parallel to the first track (track 1 in the first standard cell 502a in FIG. 5. For example, the third buffer (508c) is non-adjacent to the second buffer (508b). In another aspect, the MOS device (500) includes a fourth buffer (508d) positioned on an eight track (track 4 in the first standard cell 502 in FIG. 5) that is parallel to the first track (track 1 in the first standard cell 502a in FIG. 5). For example, the fourth buffer (508d) is non-adjacent to the third buffer (508c).

Figure 6:
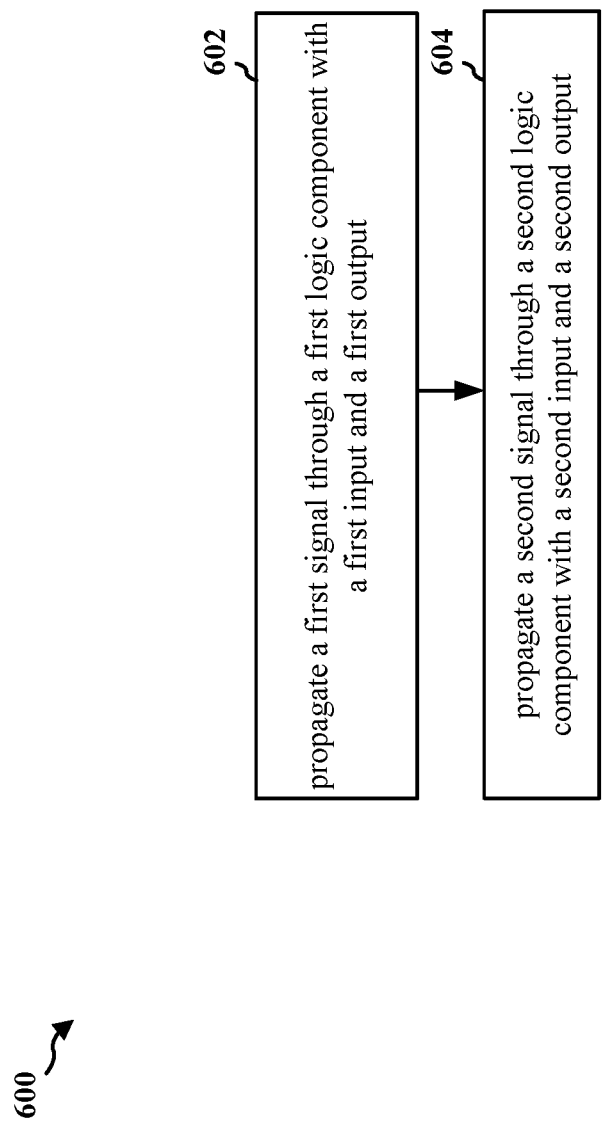
FIG. 6 is a flow chart of an exemplary method.

FIG. 6 is a flow chart 600 of an exemplary method. The exemplary method is a method of operation of a MOS IC device. For example, the MOS device may be one of the MOS IC devices 200, 300, 400 illustrated in FIGS. 2-4.

At 602, a first signal is propagated through a first logic component with a first input and a first output. In an aspect, the first input is located on a first track that extends in a first direction and a second track that extends in a second direction that is orthogonal to the first direction. In another aspect, the first output is located on the first track and a third track that extends in the second direction.

At 604, a second signal is propagated through a second logic component with a second input and a second output. In an aspect, the second input is located on the first track and a fourth track that extends in the second direction. In another aspect, the second output is located on the first track and a fifth track that extends in the second direction. In a further aspect, the fourth track and the fifth track are between the second track and the third track. For example, the MOS device includes a first interconnect on a $M_x$ layer that extends on the first track and is coupled to the first input on the second track. In another example, the MOS device includes a second interconnect on the $M_x$ layer that extends on the first track and is coupled to the first output on the third track. In a further example, the MOS device includes a third interconnect on a $M_y$ layer that extends on the first track and is coupled to the second input on the fourth track. In an aspect, y is greater than x. Still further, the MOS device includes a fourth interconnect on the $M_y$ layer that extends on the first track and is coupled to the second output on the fifth track.

The MOS device further includes first means for propagating a signal through a first logic component with a first input and a first output. In an aspect, the first input is located on a first track that extends in a first direction and a second track that extends in a second direction that is orthogonal to the first direction. In another aspect, the first output is located on the first track and a third track that extends in the second direction.

The MOS device further includes second means for propagating a signal through a second logic component with a second input and a second output. In an aspect, the second input is located on the first track and a fourth track that extends in the second direction. In another aspect, the second output is located on the first track and a fifth track that extends in the second direction. In a further aspect, the fourth track and the fifth track are between the second track and the third track. For example, the MOS device includes a first interconnect on a $M_x$ layer that extends on the first track and is coupled to the first input on the second track. In another example, the MOS device includes a second interconnect on the $M_x$ layer that extends on the first track and is coupled to the first output on the third track. In a further example, the MOS device includes a third interconnect on a $M_y$ layer that extends on the first track and is coupled to the second input on the fourth track. In an aspect, y is greater than x. Still further, the MOS device includes a fourth interconnect on the $M_y$ layer that extends on the first track and is coupled to the second output on the fifth track.

MOS IC device standard cells may be designed up to the metal x (Mx) layer interconnect, where x≤3. One way to reduce the parasitic resistance of smaller MOS IC devices may be to design the standard cells up to a higher metal layer, such as an metal 5 (M5) layer interconnect or an metal 6 (M6) layer interconnect. By designing standard cells with higher metal layer interconnects, additional vias may also be included that connect the higher metal layer interconnects to lower metal layer interconnects. The additional metal layer interconnects and vias may provide additional parallel current paths that are able to reduce the overall parasitic resistance of the standard cell, as compared to a standard cell only designed up to the Mx layer interconnect.

In addition, using conventional standard cell architecture, when two interconnects on two different metal layer interconnects (e.g., a higher M9 layer and a lower M7 layer) carrying different signals occupy the same track in a MOS IC device and are connected to two different standard cells having inputs and outputs on the same track, the interconnect on the lower metal layer may need to be routed around the track. Routing the interconnect around the track may be necessary because the interconnect on the lower metal layer may run into an input/output stack of the interconnect of the higher metal layer. The routing detour may cause a signal delay on the interconnect on the lower metal layer, and the accumulated signal delay of the interconnect on the lower metal layer may cause a decrease in datapath speed for the MOS IC device, as discussed supra with respect to FIG. 1.

The present disclosure provides a solution to the problem by providing a 2-bit buffer with input/output pins for a lower metal layer interconnect signal line (208a, 208b, 308a, 308b, 408a, 408b) on edges of a 2-bit buffer standard cell. Further, input/output pins of the higher metal layer interconnect signal line (210a, 210b, 310a, 310b, 410a, 410b) are located between the input/output pins of the lower metal layer interconnect signal line (208a, 208b, 308a, 308b, 408a, 408b). With the first input (204a, 304a, 404a), the second input (204b, 304b, 404b), the first output (206a, 306a, 406a), and the second output (206b, 306b, 406b) as shown in FIGS. 2-4, the connection of the higher metal layer interconnect signal line (210a, 210b, 310a, 310b, 410a, 410b) to the MOS IC device (200, 300, 400) may not block a connection of the lower metal layer interconnect signal line (208a, 208b, 308a, 308b, 408a, 408b) to the MOS IC device (200, 300, 400) on the first track. Therefore, routing detours of the lower metal layer interconnect signal lines (208a, 208b, 308a, 308b, 408a, 408b) may be avoided and datapath speeds may be improved in the MOS IC devices (200, 300, 400) illustrated in FIGS. 2-4.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A metal oxide semiconductor (MOS) device, comprising:
    a first logic component with a first input and a first output, the first input being located on a first track extending in a first direction and a second track extending in a second direction orthogonal to the first direction, the first output being located on the first track and a third track extending in the second direction;
    a second logic component with a second input and a second output, the second input being located on the first track and a fourth track extending in the second direction, the second output being located on the first track and a fifth track extending in the second direction, the fourth track and the fifth track being between the second track and the third track;
    a first interconnect on a metal x ($M_x$) layer extending on the first track and coupled to the first input on the second track;
    a second interconnect on the $M_x$ layer extending on the first track and coupled to the first output on the third track;
    a third interconnect on a metal y ($M_y$) layer extending on the first track and coupled to the second input on the fourth track, y being greater than x; and
    a fourth interconnect on the $M_y$ layer extending on the first track and coupled to the second output on the fifth track.

2. The MOS device of claim 1, wherein the first logic component and the second logic component are part of a standard cell in the MOS device.

3. The MOS device of claim 2, wherein the first interconnect, the second interconnect, the third interconnect, and the fourth interconnect are inter-cell routing between the standard cell and at least one other standard cell.

4. The MOS device of claim 2, wherein the standard cell is a quadruple height cell with four rows including a first row, a second row adjacent the first row, a third row adjacent the second row, and a fourth row adjacent the third row, the second track being in the first row, the third track being in the fourth row, the fourth track being in one of the second row or the third row, and the fifth track being in another one of the second row or the third row.

5. The MOS device of claim 1, wherein the first input corresponds to a first input pin, the first output corresponds to a first output pin, the second input corresponds to a second input pin, and the second output corresponds to a second output pin, and wherein:
    the first input pin corresponds to a metal x-$z_1$ ($M_{x-z1}$) layer interconnect, where $z_1 \geq 1$;
    the first output pin corresponds to a metal x-$z_2$ ($M_{x-z2}$) layer interconnect, where $z_2 \geq 1$;
    the second input pin corresponds to a metal y-$z_3$ ($M_{y-z3}$) layer interconnect, where $z_3 \geq 1$; and
    the second output pin corresponds to a metal y-$z_4$ ($M_{y-z4}$) layer interconnect, where $z_4 \geq 1$.

6. The MOS device of claim 5, wherein $z_1$, $z_2$, $z_3$, and $z_4$ are each equal to 1.

7. The MOS device of claim 1, wherein x is equal to 7 and y is equal to 9.

8. The MOS device of claim 1, wherein the fifth track is between the fourth track and the third track, the first interconnect and the third interconnect overlap in a third direction, and the second interconnect and the fourth interconnect overlap in the third direction, the third direction being orthogonal to the first direction and the second direction.

9. The MOS device of claim 1, wherein the fourth track is between the fifth track and the third track, the first interconnect and the fourth interconnect overlap in a third direction, and the second interconnect and the third interconnect overlap in the third direction, the third direction being orthogonal to the first direction and the second direction.

10. The MOS device of claim 1, wherein the first logic component is a first buffer, and the second logic component is a second buffer.

11. The MOS device of claim 1, wherein the first track is a vertical track, and wherein the second track, the third track, the fourth track, and the fifth track are each horizontal tracks.

12. The MOS device of claim 1, wherein the first track is a horizontal track, and wherein the second track, the third track, the fourth track, and the fifth track are each vertical tracks.

13. The MOS device of claim 1, wherein the first logic component and the second logic component are part of a first buffer positioned on the first track, the MOS device further comprising:
    a second buffer positioned on a sixth track that is parallel to the first track, the second buffer being non-adjacent to the first buffer;
    a third buffer positioned on a seventh track that is parallel to the first track, the third buffer being non-adjacent to the second buffer; and
    a fourth buffer positioned on an eight track that is parallel to the first track, the fourth buffer being non-adjacent to the third buffer.

14. A method of operating a metal oxide semiconductor (MOS) device, the method comprising:
    propagating a first signal through a first logic component with a first input and a first output, the first input being located on a first track extending in a first direction and a second track extending in a second direction orthogonal to the first direction, the first output being located on the first track and a third track extending in the second direction;
    propagating a second signal through a second logic component with a second input and a second output, the second input being located on the first track and a fourth track extending in the second direction, the second output being located on the first track and a fifth track extending in the second direction, the fourth track and the fifth track being between the second track and the third track, wherein the MOS IC device comprises:
- a first interconnect on a metal x ($M_x$) layer extending on the first track and coupled to the first input on the second track;
- a second interconnect on the $M_x$ layer extending on the first track and coupled to the first output on the third track;
- a third interconnect on a metal y ($M_y$) layer extending on the first track and coupled to the second input on the fourth track, y being greater than x; and
- a fourth interconnect on the $M_y$ layer extending on the first track and coupled to the second output on the fifth track.

15. The method of claim 14, wherein the first logic component and the second logic component are part of a standard cell in the MOS device.

16. The method of claim 15, wherein the first interconnect, the second interconnect, the third interconnect, and the fourth interconnect are inter-cell routing between the standard cell and at least one other standard cell.

17. The method of claim 15, wherein the standard cell is a quadruple height cell with four rows including a first row, a second row adjacent the first row, a third row adjacent the second row, and a fourth row adjacent the third row, the second track being in the first row, the third track being in the fourth row, the fourth track being in one of the second row or the third row, and the fifth track being in another one of the second row or the third row.

18. The method of claim 14, wherein the first input corresponds to a first input pin, the first output corresponds to a first output pin, the second input corresponds to a second input pin, and the second output corresponds to a second output pin, and wherein:
- the first input pin corresponds to a metal x-$z_1$ ($M_{x-z1}$) layer interconnect, where $z_1 \geq 1$;
- the first output pin corresponds to a metal x-$z_2$ ($M_{x-z2}$) layer interconnect, where $z_2 \geq 1$;
- the second input pin corresponds to a metal y-$z_3$ ($M_{y-z3}$) layer interconnect, where $z_3 \geq 1$; and
- the second output pin corresponds to a metal y-$z_4$ ($M_{y-z4}$) layer interconnect, where $z_4 \geq 1$.

19. The method of claim 18, wherein $z_1$, $z_2$, $z_3$, and $z_4$ are each equal to 1.

20. The method of claim 14, wherein x is equal to 7 and y is equal to 9.

21. The method of claim 14, wherein the fifth track is between the fourth track and the third track, the first interconnect and the third interconnect overlap in a third direction, and the second interconnect and the fourth interconnect overlap in the third direction, the third direction being orthogonal to the first direction and the second direction.

22. The method of claim 14, wherein the fourth track is between the fifth track and the third track, the first interconnect and the fourth interconnect overlap in a third direction, and the second interconnect and the third interconnect overlap in the third direction, the third direction being orthogonal to the first direction and the second direction.

23. The method of claim 14, wherein the first logic component is a first buffer, and the second logic component is a second buffer.

24. The method of claim 14, wherein the first track is a vertical track, and wherein the second track, the third track, the fourth track, and the fifth track are each horizontal tracks.

25. The method of claim 14, wherein the first track is a horizontal track, and wherein the second track, the third track, the fourth track, and the fifth track are each vertical tracks.

26. The method of claim 14, wherein the first logic component and the second logic component are part of a first buffer positioned on the first track, the MOS device further comprising:
- a second buffer positioned on a sixth track that is parallel to the first track, the second buffer being non-adjacent to the first buffer;
- a third buffer positioned on a seventh track that is parallel to the first track, the third buffer being non-adjacent to the second buffer; and
- a fourth buffer positioned on an eight track that is parallel to the first track, the fourth buffer being non-adjacent to the third buffer.

27. A metal oxide semiconductor (MOS) device, comprising:
- first means for propagating a first signal through a first logic component with a first input and a first output, the first input being located on a first track extending in a first direction and a second track extending in a second direction orthogonal to the first direction, the first output being located on the first track and a third track extending in the second direction; and
- second means for propagating a second signal through a second logic component with a second input and a second output, the second input being located on the first track and a fourth track extending in the second direction, the second output being located on the first track and a fifth track extending in the second direction, the fourth track and the fifth track being between the second track and the third track, wherein the MOS IC device further comprises:
    - a first interconnect on a metal x ($M_x$) layer extending on the first track and coupled to the first input on the second track;
    - a second interconnect on the $M_x$ layer extending on the first track and coupled to the first output on the third track;
    - a third interconnect on a metal y ($M_y$) layer extending on the first track and coupled to the second input on the fourth track, y being greater than x; and
    - a fourth interconnect on the $M_y$ layer extending on the first track and coupled to the second output on the fifth track.

28. The MOS device of claim 27, wherein the first logic component and the second logic component are part of a standard cell in the MOS device.

29. The MOS of claim 28, wherein the first interconnect, the second interconnect, the third interconnect, and the fourth interconnect are inter-cell routing between the standard cell and at least one other standard cell.

30. The MOS device of claim 27, wherein the first input corresponds to a first input pin, the first output corresponds to a first output pin, the second input corresponds to a second input pin, and the second output corresponds to a second output pin, and wherein:
- the first input pin corresponds to a metal x-$z_1$ ($M_{x-z1}$) layer interconnect, where $z_1 \geq 1$;
- the first output pin corresponds to a metal x-$z_2$ ($M_{x-z2}$) layer interconnect, where $z_2 \geq 1$;
- the second input pin corresponds to a metal y-$z_3$ ($M_{y-z3}$) layer interconnect, where $z_3 \geq 1$; and the second output pin corresponds to a metal y-$z_4$ ($M_{y\text{-}z4}$) layer interconnect, where $z_4 \geq 1$.

* * * * *